United States Patent
Chen et al.

(10) Patent No.: US 11,095,324 B2
(45) Date of Patent: Aug. 17, 2021

(54) WIRELESS TRANSMISSION CIRCUIT AND CONTROL METHOD THEREOF

(71) Applicant: Realtek Semiconductor Corporation, Hsinchu (TW)

(72) Inventors: Jian-You Chen, Hsinchu (TW); Hsiao-Tsung Yen, Hsinchu (TW); Beng-Meng Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/817,718

(22) Filed: Mar. 13, 2020

(65) Prior Publication Data
US 2021/0044309 A1    Feb. 11, 2021

(30) Foreign Application Priority Data
Aug. 7, 2019 (TW) ................... 108128139

(51) Int. Cl.
*H04B 1/04* (2006.01)
*H03H 7/18* (2006.01)
(Continued)

(52) U.S. Cl.
CPC ............ *H04B 1/0475* (2013.01); *H03F 3/24* (2013.01); *H03H 7/0115* (2013.01); *H03H 7/18* (2013.01)

(58) Field of Classification Search
CPC .. H04B 1/0475; H04B 1/0483; H04B 10/808; H04B 10/07955; H04B 3/30;
(Continued)

(56) References Cited

U.S. PATENT DOCUMENTS 7,382,887 B2 * 6/2008 Brodkin .................. H04R 5/04
                                                    330/149
8,923,168 B2 * 12/2014 Mikhemar ........... H04B 1/0458
                                                    370/279
(Continued)

FOREIGN PATENT DOCUMENTS

EP         2518901 B1     3/2016
WO      2018026455 A1     2/2018
WO      2018212900 A1    11/2018

OTHER PUBLICATIONS

Dong Jing et al., "New Linearization Method Using Interstage Second Harmonic Enhancement", IEEE Microwave and Guided Wave Letters, vol. 8, No. 11, Nov. 1998.
(Continued)

*Primary Examiner* — Lana N Le
(74) *Attorney, Agent, or Firm* — Locke Lord LLP; Tim Tingkang Xia, Esq.

(57) ABSTRACT

A wireless transmission circuit includes a first induction circuit, a second induction circuit, a detection circuit, a first signal adjustment circuit, and a third induction circuit. The first induction circuit is configured to receive a first signal outputted from a power amplifier. The second induction circuit is configured to output the received first signal as a second signal. The detection circuit is configured to detect a common mode signal associated with the first signal. The first signal adjustment circuit is configured to adjust a phase or an amplitude of the common mode signal to generate a third signal. The third induction circuit is configured to receive the third signal and be coupled to the second induction circuit to reduce a second harmonic in the second signal.

20 Claims, 4 Drawing Sheets

(51) Int. Cl.
   *H03H 7/01* (2006.01)
   *H03F 3/24* (2006.01)
(58) Field of Classification Search
   CPC .... H04B 10/27; H04B 5/0012; H04B 5/0037;
               H04B 10/272; H04B 10/806; H04B
               5/0075; H04B 10/00; H04B 10/1123;
               H04B 10/116; H04B 10/25; H04B
               10/25751; H04B 1/18; H04B 1/525;
               H04B 3/28; H04B 1/0458; H04B
               2203/5483; H04B 2203/5491; H04B 3/04;
               H04B 3/32; H04B 3/54; H04B 3/56;
               H04B 5/0031; H04B 5/0093; H03H
               7/0115; H03H 7/18; H02J 50/12; H02J
               7/025; H02J 50/10; G01R 27/2611; G01R
               27/28; H04L 25/0274; H04L 25/061;
               H04L 27/20; H03F 3/24; H03F 1/565;
               H03F 1/3211; H03F 1/3205; H03F
               2203/45731; H03F 3/45188; H03F 3/245;
               H03F 3/211; H03F 3/45475; H03F
               2200/171; H03F 1/26; H03F 2200/411;
               H03F 2200/451; H03F 2200/108
   USPC .... 455/114.1, 114.2, 114.3, 115.1, 116, 501,
               455/63.1, 67.16, 278.1, 296, 304, 306,
               455/307, 292, 41.1, 42, 60, 139, 276.1;
               330/192, 195, 196, 197, 165, 167, 169,
               330/171, 122, 105, 86, 110, 143, 144
   See application file for complete search history.

(56) References Cited

U.S. PATENT DOCUMENTS

| | | | | |
|---|---|---|---|---|
| 9,685,910 | B2* | 6/2017 | Babaie | H01F 27/2823 |
| 10,483,937 | B2 | 11/2019 | Chen et al. | |
| 10,630,244 | B2* | 4/2020 | Sivasubramaniam | H03F 1/0272 |
| 10,763,037 | B2* | 9/2020 | Richardson | H04B 5/0087 |
| 10,911,078 | B1* | 2/2021 | Wentzloff | H04B 1/04 |
| 10,938,358 | B2* | 3/2021 | Watkins | H03F 3/602 |
| 2004/0219893 | A1* | 11/2004 | Takano | H04B 1/0483 |
| | | | | 455/114.3 |
| 2005/0053227 | A1* | 3/2005 | Fortier | H04B 3/30 |
| | | | | 379/390.04 |
| 2005/0064828 | A1* | 3/2005 | Kurakami | H04L 27/2017 |
| | | | | 455/115.1 |
| 2006/0135093 | A1* | 6/2006 | Ito | H04B 1/0475 |
| | | | | 455/126 |
| 2011/0098011 | A1* | 4/2011 | Camp, Jr. | H03F 1/0266 |
| | | | | 455/114.3 |
| 2012/0309308 | A1* | 12/2012 | Kim | H04B 5/0093 |
| | | | | 455/41.1 |
| 2014/0073243 | A1* | 3/2014 | Hijioka | H04B 5/0037 |
| | | | | 455/41.1 |
| 2014/0184334 | A1* | 7/2014 | Nobbe | H03F 3/21 |
| | | | | 330/291 |
| 2014/0273830 | A1* | 9/2014 | Wong | G06K 7/0008 |
| | | | | 455/41.1 |
| 2015/0229282 | A1* | 8/2015 | Kaehs | H03F 3/19 |
| | | | | 375/297 |
| 2015/0270806 | A1* | 9/2015 | Wagh | H03F 1/3247 |
| | | | | 330/296 |
| 2016/0028445 | A1* | 1/2016 | Mofidi | H04B 5/0025 |
| | | | | 455/41.1 |
| 2017/0040661 | A1* | 2/2017 | Ashida | H03H 7/0115 |
| 2017/0149394 | A1* | 5/2017 | Kao | H03F 1/3211 |
| 2017/0237407 | A1 | 8/2017 | Babaie et al. | |

OTHER PUBLICATIONS

Gerasimos Theodoratos et al., "A Low-Voltage 5-GHz Downconversion Mixer Employing a Second Harmonic Injection Linearization Technique", IEEE Transactions on Circuits and Systems II: Express Briefs, vol. 54, Issue: 11, Nov. 12, 2007.

Kazuma Terajima et al., "A 2.0 GHz CMOS Triple Cascade Push-Pull Power Amplifier with Second Harmonic Injection for Linearity Enhancement", Proceedings of the 9th European Microwave Integrated Circuits Conference, Oct. 6-7, 2014.

Byungjoon Park et al., "Highly Linear mm-Wave CMOS Power Amplifier", IEEE Transactions on Microwave Theory and Techniques, vol. 64, No. 12, Dec. 2016.

* cited by examiner

WIRELESS TRANSMISSION CIRCUIT AND CONTROL METHOD THEREOF

RELATED APPLICATIONS

This application claims priority to Taiwan Application Serial Number 108128139, filed Aug. 7, 2019, which is herein incorporated by reference.

TECHNICAL FIELD

The present disclosure relates to a wireless transmission circuit, and more particularly to a wireless transmission circuit and control method for reducing the second harmonic.

BACKGROUND

Due to the rarity of the spectrum and the regulations, a signal transmitted by a wireless transmitter is inhibited to interfere with other frequency bands. In the application of 2.4 GHz, the wireless transmitter may generate a second harmonic or a third harmonic when transmitting a signal, to affect other frequency bands, resulting in the poor transmission performance or quality. If a filter composed of an inductor and a capacitor is disposed on a chip, an extra area is required. In addition, the quality factor Q of the inductor is poor to limit the characteristics of the filter.

SUMMARY

In order to solve the above problems, in some implementations of the present disclosure, a wireless transmission circuit comprises a first induction circuit, a second induction circuit, a detection circuit, a first signal adjustment circuit, and a third induction circuit. The first induction circuit is configured to receive a first signal outputted from a power amplifier. The second induction circuit is configured to output the received first signal as a second signal. The detection circuit is configured to detect a common mode signal associated with the first signal. The first signal adjustment circuit is configured to adjust a phase or amplitude of the common mode signal to generate a third signal. The third induction circuit is configured to receive the third signal and be coupled to the second induction circuit to reduce a second harmonic in the second signal.

Another aspect of the present application provides a control method comprising:

receiving, by a first induction circuit, a first signal outputted from a power amplifier; receiving, by a second induction circuit coupled with the first induction circuit, the first signal and outputting the received first signal as a second signal; detecting, by a detection circuit, a common mode signal associated with the first signal; adjusting, by the first signal adjusting circuit, at least one of a phase or an amplitude of the common mode signal to generate a third signal; and receiving, by a third induction circuit, the third signal and coupling the second induction circuit to reduce a second harmonic interference in the second signal.

Based on the above, the wireless transmission circuit and the control method provided by some embodiments of the present application obtain a common mode signal mainly composed of second harmonics from the input signal, and adjust at least one of the phase or amplitude of the common mode signal to reduce the second harmonic contained in the output signal.

DETAILED DESCRIPTION

The terms "first," "second," "third," and the likes herein are used to describe various elements, components, regions, layers, and/or blocks. However, these elements, components, regions, layers, and/or blocks are not be limited by these terms. These terms are only used to identify a single element, component, region, layer, and/or block. Thus, a first element, component, region, layer, and/or block below may also be referred to as a second element, component, region, layer, and/or block without departing from the spirit of the present application.

In this disclosure, the article "a" and "the" may be used to mean one or more, unless the article is specifically defined. It should be noted that, the terms "comprising," "including," "having." and the likes used herein specify the features, regions, integers, steps, operations, elements, and/ or components described, but do not preclude one or more of other features, regions, integers, steps, operations, elements, components, and/or groups thereof.

Unless otherwise defined, all terms used herein (including technical and scientific terms) have their ordinary meaning, which can be understood by those skilled in this art. Furthermore, the definition of the above terms in the commonly used dictionary should be interpreted to be consistent with the meaning in the relevant field of the present application in the disclosure of this specification. Unless specifically defined, these terms are not to be interpreted as idealized or overly formal.

When one element is referred to as "connected" or "coupled" to another element, it can be directly connected or coupled to another element, or connected or coupled to another element by an additional element therebetween. In contrast, when one element is referred to as "directly connected" or "directly coupled" to another element, there is no additional element.

The following embodiments are disclosed with accompanying figures for detailed description. For illustration clarity, many details of practice are explained in the following descriptions. However, it should be understood that these details of practice do not intend to limit the present application. That is, these details of practice are not necessary in parts of embodiments of the present application. Furthermore, for simplifying the drawings, some of the conventional structures and elements are shown with schematic illustrations.

Figure 1A:
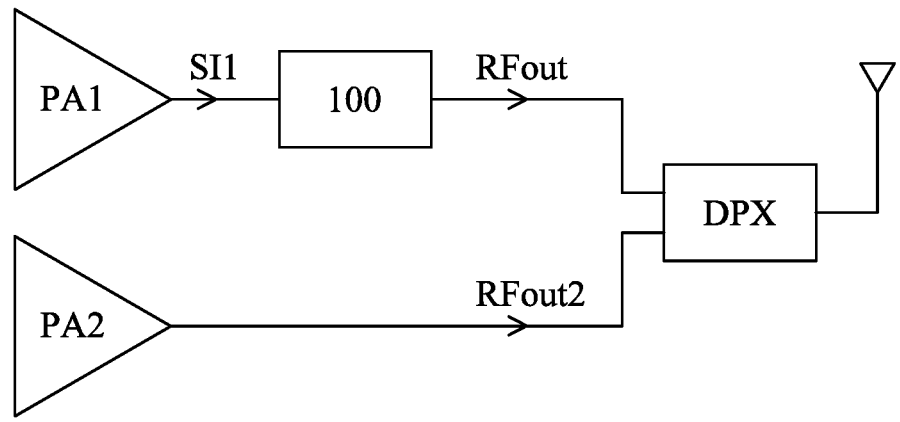
FIG. 1A is a schematic diagram of a multi-band transmission circuit depicted according to some embodiments of the present application.

Referring to FIG. 1A, FIG. 1A is a schematic diagram of a multi-band transmission circuit depicted according to some embodiments of the present application. In some embodiments, the multi-band transmission circuit may be applied to a related device adopting the 802.11ac networking standard, wherein the frequency of the first signal SI1 is about 2.4 GHz, and the frequency of the second signal is about 5 GHz. However, the present application is not limited thereto.

In some embodiments, the multi-band transmission circuit includes a power amplifier PA1, a power amplifier PA2, a wireless transmission circuit 100, and a diplexer DPX. The power amplifier PA1 transmits the first signal SI1 to the wireless transmission circuit 100. The wireless transmission circuit 100 processes the first signal SI1 into an output signal RFout, and transmits the output signal RFout to the diplexer DPX. The power amplifier PA2 transmits an output signal RFout2 to the diplexer DPX. The diplexer DPX may selectively output the output signal RFout or the output signal RFout2 via an antenna.

Figure 1B:
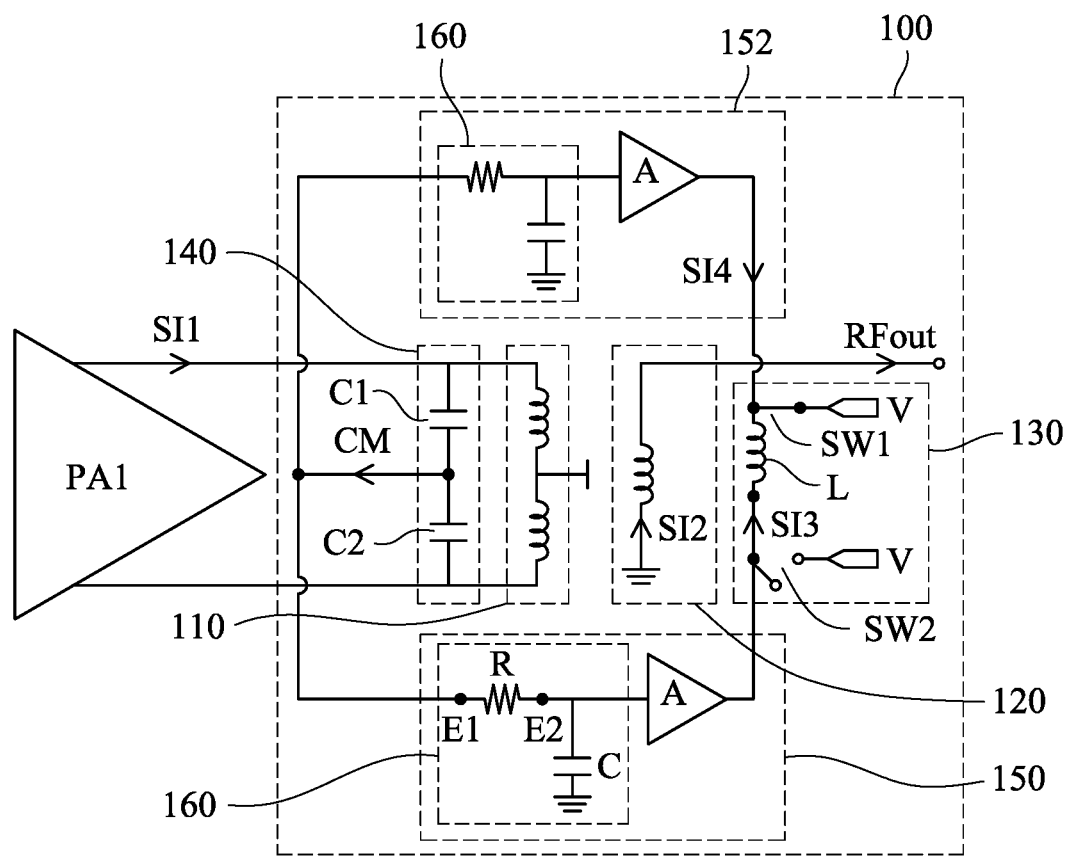
FIG. 1B is a schematic diagram of a wireless transmission circuit depicted according to some embodiments of the present application.

Referring to FIG. 1B, FIG. 1B is a schematic diagram of a wireless transmission circuit 100 depicted according to some embodiments of the present application. In some embodiments, the wireless transmission circuit 100 obtains the signal component with the second harmonics from the first signal SI1 and adjusts at least one of the phase or amplitude thereof to reduce the second harmonic in the second signal S12 to generate the output signal RFout.

Referring to FIG. 1B, FIG. 1B is a schematic diagram of a wireless transmission circuit 100 depicted according to some embodiments of the present application. In some embodiments, the wireless transmission circuit 100 includes a first induction circuit 110, a second induction circuit 120, a third induction circuit 130, a detection circuit 140, and a first signal adjustment circuit 150.

In some embodiments, the first induction circuit 110 is configured to receive the first signal SI1 output from the power amplifier PA1, and couple the first signal SI1 to the second induction circuit 120. For example, the first induction circuit 110 may include a winding, and the second induction circuit 120 may include another winding. The winding of the first induction circuit 110 is disposed adjacent to the winding of the second induction circuit 120 to couple the first signal SI1 to the second induction circuit 120. In some embodiments, the winding of the first induction circuit 110 may be implemented by a center-tapped winding. However, the present application is not limited thereto.

In some embodiments, the detection circuit 140 is configured to detect a common mode signal CM associated with the first signal SI1. For example, the detection circuit 140 includes a plurality of capacitors C1 and C2. The capacitors C1 and C2 are coupled in series between the two output ends of the power amplifier PA1 to divide the voltage of the first signal SI1 to generate the common mode signal CM, and transmit the common mode signal CM to the first signal adjustment circuit 150.

The above description is only made by means of voltage division, and various related settings for generating the common mode signal CM are covered by the present application.

In some embodiments, the power amplifier PA1 is configured as a differential circuit. Under this condition, the voltage difference between the two output ends of the power amplifier PA1 is the first signal SI1. In contrast, the odd harmonic components in the signals at both ends of the power amplifier PA1 may counteract each other, so that the components of the common mode signal CM mainly include the second harmonic signal.

In some embodiments, the first signal adjustment circuit 150 includes a phase shifting circuit 160 and an operational circuit A. The phase shifting circuit 160 is coupled between the detection circuit 140 and the operational circuit A, and is configured to adjust the phase of the common mode signal CM. In some embodiments, the phase shifting circuit 160 includes a resistor R and a capacitor C. A first end E1 of the resistor R is configured to receive the common mode signal CM, and a second end E2 of the resistor R is configured to transmit the common mode signal CM to the operational circuit A. The capacitor C is coupled between the second end E2 of the resistor R and the ground, wherein the resistance of the resistor R or the capacitance of the capacitor C is configured to adjust the phase of the common mode signal CM. The phase shifting circuit 160 adjusts the phase of the third signal SI3 or the phase the fourth signal SI4 to 0 degrees, 45 degrees, or 90 degrees.

The operational circuit A is coupled to the detection circuit 140, and is configured to adjust the amplitude of the common mode signal CM to generate the third signal S13 to the third induction circuit 130. In some embodiments, the operational circuit A may be implemented by an amplifier circuit or an adjustable gain circuit amplifier circuit. However, the present application is not limited thereto.

In some embodiments, the first signal adjustment circuit 150 may be operated without the phase shifting circuit 160. For example, the gain of the operational circuit A may be set to −1 to generate the third signal SI3 that is completely opposite to the phase of the first signal SI1, to counteract the influence of the second harmonic signal. The above gain setting is used as an example, and the present application is not limited thereto.

In some embodiments, the third induction circuit 130 is configured to receive the third signal S13, and be coupled to the second induction circuit 120 to reduce the second harmonic interference in the second signal SI2. For example, the third induction circuit 130 may be implemented by a winding or an inductor and disposed adjacent to the second induction circuit 120 to couple the third signal SI3 to the second induction circuit 120. As a result, in the second induction circuit 120, the second harmonic of the second signal SI2 may be counteracted by the third signal SI3, to provide the output signal RFout with the reduced second harmonic.

In some embodiments, the wireless transmission circuit 100 further includes a second signal adjustment circuit 152. The second signal adjustment circuit 152 is configured to adjust at least one of a phase or amplitude of the common mode signal CM to generate a fourth signal SI4. In this example, the third induction circuit 130 is further configured to receive the third signal SI3 or the fourth signal SI4, and be coupled to the second induction circuit 120 to reduce the second harmonic interference in the second signal SI2. The operation or setting manner of the second signal adjustment circuit 152 is similar to that of the first signal adjustment circuit 150, and thus the details are not repeated herein.

In some embodiments, the circuit structure of the first signal adjustment circuit 150 is the same with that of the second signal adjustment circuit 152. For example, each of the first signal adjustment circuit 150 and the second signal adjustment circuit 152 includes an operational circuit A and a phase shifting circuit 160. Alternatively, as previously described, in some embodiments, each of the first signal adjustment circuit 150 and the second signal adjustment circuit 152 may be operated without the phase shifting circuit 160.

In some embodiments, the third induction circuit 130 includes an inductor L, a first switch SW1, and a second switch SW2. The inductor L is coupled to the second induction circuit 120. The first switch SW1 is coupled between the first end of the inductor L and a predetermined voltage source V, wherein the first end of the inductor L is configured to receive the fourth signal SI4. The second switch SW2 is coupled between the second end of the inductor L and the predetermined voltage source V, wherein the second end of the inductor L is configured to receive the third signal SI3.

In some embodiments, when the inductor L receives the fourth signal SI4, the second switch SW2 is turned on (e.g., closed) and the first switch SW1 is turned off (e.g., open). When the inductor L receives the third signal SI3, the first switch SW1 is turned on and the second switch SW2 is turned off.

Figure 2:
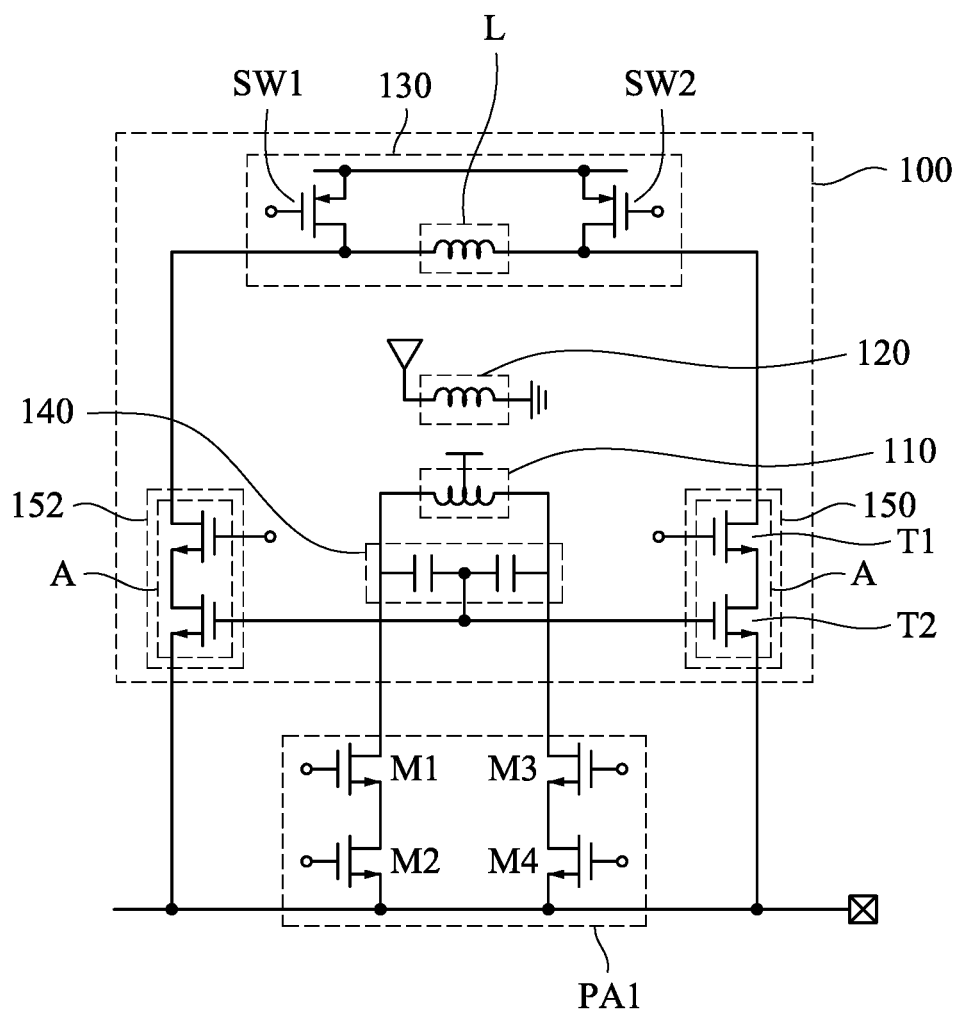
FIG. 2 is a schematic diagram of components of a wireless transmission circuit and a power amplifier depicted according to some embodiments of the present application.

Referring to FIG. 2, FIG. 2 is a schematic diagram of components of a wireless transmission circuit 100 and a power amplifier PA1 depicted according to some embodiments of the present application. In this embodiment, the first signal adjustment circuit 150 and the second signal adjustment circuit 152 are configured to be operated without the phase shifting circuit 160. The operational circuit A includes a plurality of transistors T1-T2, and is configured to adjust the amplitude of the common mode signal CM. The power amplifier PA1 is implemented by a plurality of transistors M1-M4 to output the first signal SI1.

In some embodiments, the first end of the transistor M1 is coupled to the first end of the first induction circuit 110, and the transistor M2 is coupled between the second end of the transistor M1 and the predetermined voltage source (e.g., but not limited to the ground voltage). The first end of the transistor M3 is coupled to the second end of the first induction circuit 110, and the transistor M4 is coupled between the second end of the transistor M3 and the above predetermined voltage source. In some embodiments, the voltage difference between the first end of the transistor M1 and the first end of the transistor M3 may be considered as the first signal SI1. The control end of the transistor M1 and the control end of the transistor M3 may be configured to receive a bias voltage (not shown), and the control end of the transistor M2 and the control end of the transistor M4 may receive the data signal to be amplified (not shown).

In some embodiments, the operational circuit A includes a plurality of transistors T1-TZ. In the example of the first signal adjustment circuit 150, the first end of the transistor T1 is coupled to the third induction circuit 130, and the second end of the transistor T1 is coupled in series to the transistor T2. The transistor T2 is configured to output the third signal SI3, and the transistor T1 is operated as a buffer of T2 and provides isolation. In some embodiments, the control end of the transistor T1 receives a bias voltage (not shown), and the control end of the transistor T2 receives the common mode signal and the bias voltage (not shown), and sets the gain of the operational circuit A by adjusting the bias voltage.

In some embodiments, the closing of the switch SW1 or SW2 in FIG. 2 means that the two ends of the switch are electrically connected to each other to allow the electronic signal to flow from one end to the other end. The opening of the switch means that there is no electrical connection between the two ends of the switch to allow the electronic signal to pass therethrough. The first switch SW1 and the second switch SW2 may be implemented by a transistor or any elements that may achieve the above functions. In the embodiment of FIG. 2, switches SW1 and SW2 are realized by PMOS, but the present disclosure is not limited to this.

In some embodiments, the first induction circuit 110 may include a center-tapped transformer or an inductor to divide the first induction circuit 110 into a first secondary winding and a second secondary winding that are coupled to each other. In some embodiments, the first induction circuit 110 and the second induction circuit 120 may also be a transformer with only one winding, and the circuit of the transformer may be implemented according to any manner well known to those skilled in the art.

In some embodiments, the windings used in the first induction circuit 110, the second induction circuit 120, and the third induction circuit 130 may be disposed within the chip using elements such as conductive lines or metal layers. As a result, the windings of the above circuits may be integrated in a single chip, to reduce the number of elements used in an external circuit (e.g. an additional filter on a circuit board) in the wireless transmission circuit. The following table describes the comparison of the output signals of the conventional band rejection filter with the embodiment of FIG. 2. In some embodiments, the wireless transmission circuit 100 may reduce the circuit area and effectively reduce the second harmonic component of the output signal.

|  | Control group | Using the band rejection filter (conventional) | The embodiment of FIG. 2 |
| --- | --- | --- | --- |
| Normal output power (dBm) | 18 | 18 | 18 |
| Second harmonic power (dBm) | −30 | −34 | −45 |

Figure 3:
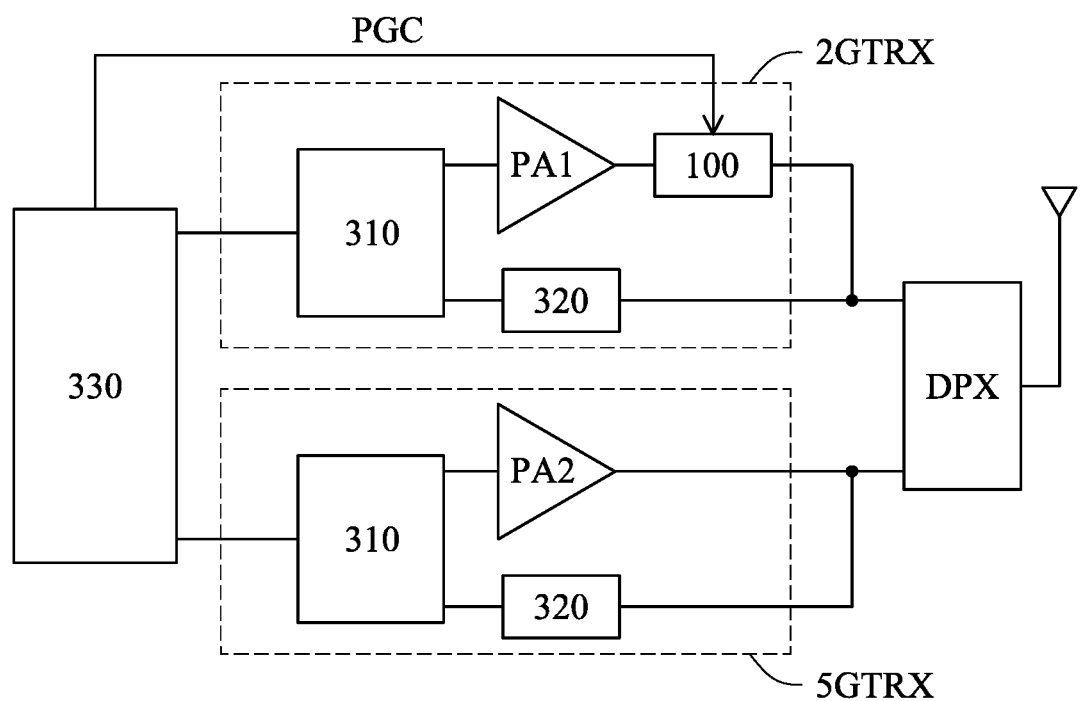
FIG. 3 is a schematic diagram of application of the wireless transmitter depicted according to some embodiments of the present application.

Referring to FIG. 3, FIG. 3 is a schematic diagram of application of the wireless transmitter 300 depicted according to some embodiments of the present application. The wireless transmitter 300 includes a baseband processing circuit 330, a 2G wireless transceiver 2GTRX, a 5G wireless transceiver 5GTRX, and a diplexer DPX.

In some embodiments, the 2G wireless transceiver 2GTRX includes a signal processing circuit 310, a receiver 320, a power amplifier PA1, and a wireless transmission circuit 100. The baseband processing circuit 330 is configured to send a digital signal (not shown) to the signal processing circuit 310. The signal processing circuit 310 converts the digital signal into an analog signal and transmits it to the power amplifier PAL The power amplifier PA1 outputs the first signal SI1 to the wireless transmission circuit 100 to perform the process for reducing the second harmonic. Finally, the wireless transmission circuit 100 sends the processed output signal RFout to the diplexer DPX. In some embodiments, the 5G wireless transceiver 5GTRX also includes a signal processing circuit 310, a receiver 320, and a power amplifier PA2.

In some embodiments, the wireless transmitter 300 may simultaneously turn on the 2G wireless transceiver 2GTRX and the 5G wireless transceiver 5GTRX to perform the system calibration procedure. In the calibration procedure, when the 2G wireless transceiver 2GTRX outputs the signal, the 5G wireless transceiver 5GTRX receives the output signal RFout of the 2G wireless transceiver 2GTRX using a receiver 320, demodulates the output signal RFout, and sends it to the baseband processing circuit 330. The baseband processing circuit 330 calculates the second harmonic interference caused by the output signal RFout based on the demodulated output signal RFout. The baseband processing circuit 330 generates a calibration signal PGC according to the calculation result to control the wireless transmission circuit 100 to perform the phase and gain adjustment of the common mode signal CM, so that the wireless transmission circuit 100 reduces the second harmonic component of the output signal RFout.

Figure 4:
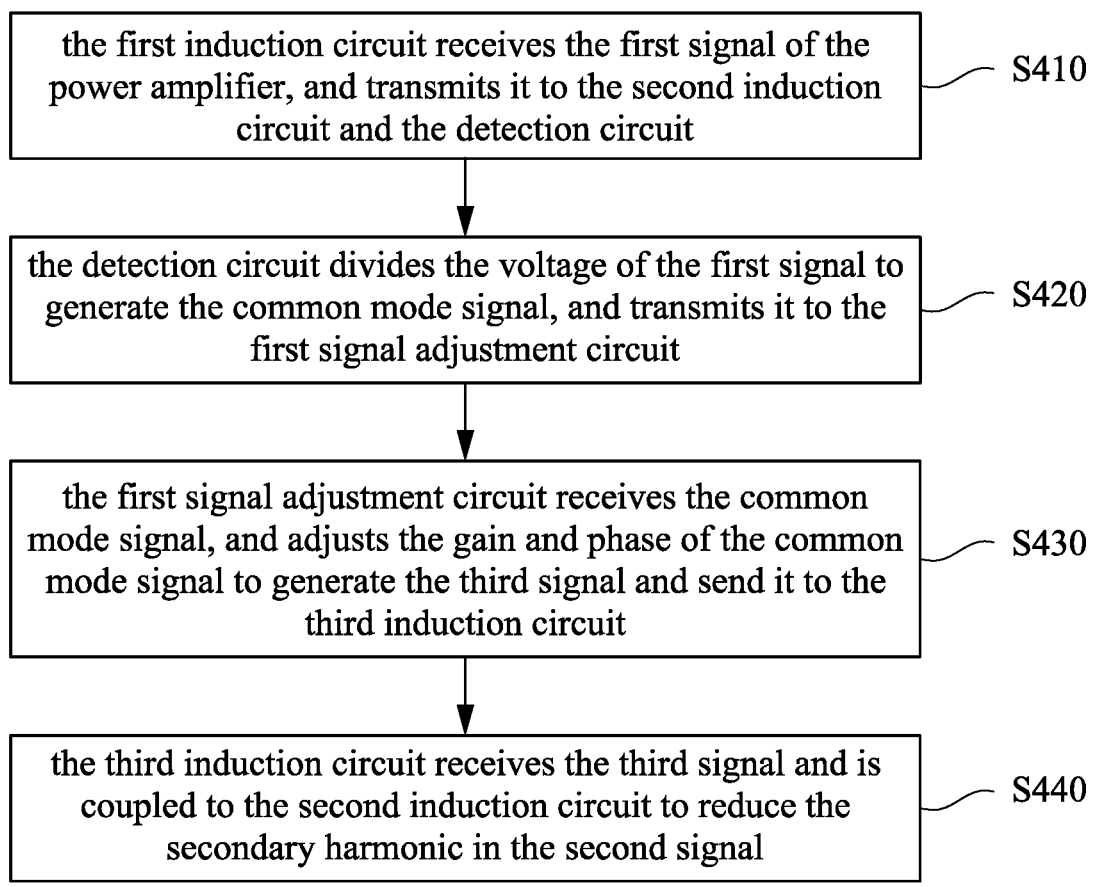
FIG. 4 is a flowchart of a control method depicted according to some embodiments of the present application.

Referring to FIG. 4, FIG. 4 is a flowchart of a control method 400 depicted according to some embodiments of the present application. For ease of understanding, the control method 400 will be described with reference to FIGS. 1A-3. In some embodiments, the control method 400 may be applied to the second harmonic signal processing of the wireless transmission circuit 100 to reduce mutual interference between the circuits with different frequency bands.

In the operation S410, the first induction circuit 110 receives the first signal SI1 of the power amplifier PA1, and transmits it to the second induction circuit 120 and the detection circuit 140.

In the operation S420, the detection circuit 140 divides the voltage of the first signal SI1 to generate the common mode signal CM, and transmits it to the first signal adjustment circuit 150.

In some embodiments, the detection circuit 140 divides the voltage of the first signal SI1 to generate the common mode signal CM, and transmits it to the second signal adjustment circuit 152.

In the operation S430, the first signal adjustment circuit 150 receives the common mode signal CM, and adjusts the gain and phase of the common mode signal CM to generate the third signal SI3 and sends it to the third induction circuit 130.

In some embodiments, the second signal adjustment circuit 152 receives the common mode signal CM, and adjusts the gain and phase of the common mode signal CM to generate the fourth signal SI4 and sends it to the third induction circuit 130.

In the operation S440, the first switch SW1 is turned on and the second switch SW2 is turned off. The third induction circuit 130 receives the third signal SI3 and is coupled to the second induction circuit 120 to reduce the second harmonic in the second signal SI2 to generate the output signal RFout.

In some embodiments, the first switch SW1 is turned off and the second switch SW2 is turned on. The third induction circuit 130 receives the fourth signal SI4 and is coupled to the second induction circuit 120 to reduce the second harmonic in the second signal SI2 to generate the output signal RFout.

The various operations of the control method 400 described above are only for illustration, and are not limited to being performed in the order of this example. Various operations in the control method may be appropriately added, substituted, omitted, or performed in a different order, without departing from the scope of the various embodiments of the present application.

Based on the above, the wireless transmission circuit 100 and the control method 400 provided by some embodiments of the present application obtain a common mode signal CM mainly composed of second harmonics from the first signal SI1, and adjust at least one of the phase or amplitude of the common mode signal CM to reduce the second harmonic contained in the output signal RFout.

Although the present application has been described in considerable detail with reference to certain embodiments thereof, it is not used to limit the present application. It will be apparent to those skilled in the art that various modifications and variations may be made without departing from the scope or spirit of the present application. Thus, the scope of the present application falls within the scope of the following claims.

What is claimed is:

1. A wireless transmission circuit, comprising:
    a first induction circuit configured to receive a first signal outputted from a power amplifier;
    a second induction circuit configured to receive the first signal by coupling with the first induction circuit, and output the received first signal as a second signal;
    a detection circuit configured to detect a common mode signal associated with the first signal;
    a first signal adjustment circuit configured to adjust at least one of a phase or an amplitude of the common mode signal to generate a third signal; and
    a third induction circuit configured to receive the third signal and be coupled to the second induction circuit to reduce a second harmonic interference in the second signal.

2. The wireless transmission circuit of claim 1, wherein the first signal adjustment circuit comprises:
    an operational circuit coupled to the detection circuit and configured to receive the common mode signal, and amplify the common mode signal to generate the third signal.

3. The wireless transmission circuit of claim 2, wherein the first signal adjustment circuit further comprises:
    a phase shifting circuit coupled between the detection circuit and the operational circuit and configured to adjust the phase of the common mode signal.

4. The wireless transmission circuit of claim 3, wherein the phase shifting circuit comprises:
    a resistor, wherein a first end of the resistor is configured to receive the common mode signal and a second end of the resistor is configured to transmit the common mode signal to the operational circuit; and
    a capacitor coupled between the second end of the resistor and a ground, wherein the resistance value of the resistor or the capacitance of the capacitor is set to adjust the phase of the common mode signal.

5. The wireless transmission circuit of claim 2, wherein the operational circuit comprises a plurality of transistors configured to control the amplitude of the common mode signal to output an amplified signal, and the operational circuit comprises:
    a first transistor configured to receive a bias voltage; and
    a second transistor coupled to the first transistor in series, and configured to receive the common mode signal and the bias voltage to output the amplified signal by adjusting the bias voltage.

6. The wireless transmission circuit of claim 1, further comprising:
    a second signal adjustment circuit configured to adjust at least one of the phase or the amplitude of the common mode signal to generate a fourth signal,
    wherein the third induction circuit is further configured to selectively receive the third signal or the fourth signal, and be coupled to the second induction circuit to reduce the second harmonic interference in the second signal.

7. The wireless transmission circuit of claim 6, wherein the third induction circuit comprises:
    an inductor configured to be coupled to the second induction circuit;
    a first switch coupled between a first end of the inductor and a predetermined voltage source, wherein the first end of the inductor is configured to receive the fourth signal; and
    a second switch coupled between a second end of the inductor and the predetermined voltage source, wherein the second end of the inductor is configured to receive the third signal.

8. The wireless transmission circuit of claim 7, wherein when the inductor receives the fourth signal, the second switch is turned on and the first switch is turned off, and when the inductor receives the third signal, the first switch is turned on and the second switch is turned off.

9. The wireless transmission circuit of claim 1, wherein the common mode signal is associated with a second harmonic signal of the first signal.

10. The wireless transmission circuit of claim 1, wherein the detection circuit comprises:
a plurality of capacitors coupled in series between a plurality of output ends of the power amplifier, wherein the capacitors are configured to divide the voltage of the first signal to generate the common mode signal.

11. A control method, comprising:
receiving, by a first induction circuit, a first signal outputted from a power amplifier;
receiving, by a second induction circuit coupled with the first induction circuit, the first signal and outputting the received first signal as a second signal;
detecting, by a detection circuit, a common mode signal associated with the first signal;
adjusting, by a first signal adjustment circuit, at least one of a phase or an amplitude of the common mode signal to generate a third signal; and
receiving, by a third induction circuit, the third signal and coupling the second induction circuit to reduce a second harmonic interference in the second signal.

12. The control method of claim 11, wherein the first signal adjustment circuit comprises an operational circuit and the control method further comprises receiving, by the operational circuit, the common mode signal, and amplifying the common mode signal to generate the third signal.

13. The control method of claim 12, wherein the first signal adjustment circuit further comprises a phase shifting circuit, and adjusting, by the first signal adjustment circuit, the at least one of the phase or the amplitude of the common mode signal comprises:
adjusting, by the phase shifting circuit, the phase of the common mode signal.

14. The control method of claim 13, wherein the phase shifting circuit comprises a resistor and a capacitor, and adjusting, by the phase shifting circuit, the phase of the common mode signal comprises:

receiving, by the resistor, the common mode signal, and transmitting the common mode signal to the operational circuit; and
adjusting, by the capacitance of the capacitor or the resistance value of the resistor, the phase of the common mode signal.

15. The control method of claim 12, wherein the operational circuit comprises a plurality of transistors, and the control method further comprises controlling, by the transistors, the amplitude of the common mode signal to output an amplified signal comprises:
receiving, by a first transistor, a bias voltage; and
receiving, by a second transistor, the common mode signal and the bias voltage to output the amplified signal by adjusting the bias voltage.

16. The control method of claim 11, further comprising:
adjusting, by a second signal adjustment circuit, at least one of the phase or the amplitude of the common mode signal to generate a fourth signal,
wherein the third induction circuit is further configured to selectively receive the third signal or the fourth signal, and be coupled to the second induction circuit to reduce the second harmonic interference in the second signal.

17. The control method of claim 16, wherein the third induction circuit comprises an inductor, a first switch, and a second switch, and receiving, by the third induction circuit, the third signal and coupling the second induction circuit to reduce the second harmonic interference in the second signal comprises:
receiving, by the first switch, the fourth signal; and
receiving, by the second switch, the third signal.

18. The control method of claim 17, wherein when the inductor receives the fourth signal, the second switch is turned on and the first switch is turned off, and when the inductor receives the third signal, the first switch is turned on and the second switch is turned off.

19. The control method of claim 11, wherein the common mode signal is associated with a second harmonic signal of the first signal.

20. The control method of claim 11, wherein the detection circuit comprises a plurality of capacitors, and detecting, by the detection circuit, the common mode signal associated with the first signal comprises:
dividing, by the capacitors, the voltage of the first signal to generate the common mode signal.

* * * * *